United States Patent
Nam et al.

(10) Patent No.: US 7,585,756 B2
(45) Date of Patent: Sep. 8, 2009

(54) SEMICONDUCTOR DEVICE AND METHOD OF MANUFACTURING THE SAME

(75) Inventors: Gab-Jin Nam, Seoul (KR); Myoung-Bum Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/839,387

(22) Filed: Aug. 15, 2007

(65) Prior Publication Data

US 2008/0042173 A1    Feb. 21, 2008

(30) Foreign Application Priority Data

Aug. 17, 2006    (KR) .................... 10-2006-0077486

(51) Int. Cl.
*H01L 21/3205*    (2006.01)
(52) U.S. Cl. .................. 438/592; 438/197; 438/585; 257/412; 257/E21.002
(58) Field of Classification Search ................ 438/197, 438/585, 592; 257/412
See application file for complete search history.

(56) References Cited

U.S. PATENT DOCUMENTS

| | | | | |
|---|---|---|---|---|
| 6,326,251 B1 * | 12/2001 | Gardner et al. | ............. | 438/197 |
| 6,727,560 B1 * | 4/2004 | Pan et al. | ............. | 257/412 |
| 6,890,807 B2 * | 5/2005 | Chau et al. | ............. | 438/199 |
| 6,902,969 B2 | 6/2005 | Adetutu et al. | | |
| 7,303,983 B2 * | 12/2007 | Triyoso et al. | ............. | 438/592 |

FOREIGN PATENT DOCUMENTS

| | | |
|---|---|---|
| JP | 2002-134433 | 5/2002 |
| KR | 2003-0058664 | 7/2003 |
| KR | 2005-0028509 | 3/2005 |

OTHER PUBLICATIONS

English language abstract of Korean Publication No. 2003-0058664.
English language abstract of Korean Publication No. 2005-0028509.
English language abstract of Japanese Publication No. 2002-134433.

\* cited by examiner

*Primary Examiner*—Zandra Smith
*Assistant Examiner*—Christy L Novacek
(74) *Attorney, Agent, or Firm*—Marger Johnson & McCollom, P.C.

(57) ABSTRACT

A MOS transistor includes a substrate, source/drain regions formed at portions of the substrate, and a channel region formed between the source/drain regions. The MOS transistor further includes a gate structure having a gate insulation layer pattern and a gate electrode formed on the channel region. The gate electrode includes a first gate conductive layer pattern and a second gate conductive layer pattern. The first gate conductive layer pattern has a nitrogen concentration gradient gradually increasing from a lower portion of the first gate conductive layer pattern to an upper portion of the first gate conductive layer pattern. The second gate conductive layer pattern includes a material having a resistance substantially lower than a resistance of the first gate conductive layer pattern.

6 Claims, 5 Drawing Sheets

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 2006-77486, filed on Aug. 17, 2006, the contents of which are herein incorporated by reference in their entirety.

BACKGROUND

1. Technical Field

Embodiments of the present invention relate to a semiconductor device and a method of manufacturing the semiconductor device. More particularly, embodiments of the present invention relate to a metal oxide semiconductor (MOS) transistor having a gate electrode including metal, and a method of manufacturing the MOS transistor.

2. Description of the Related Art

It is desirable for a gate insulation layer pattern in a conventional metal oxide semiconductor (MOS) transistor to have a thin equivalent oxide thickness (EOT) and to sufficiently reduce a leakage current between a gate conductive layer pattern and a channel region of the MOS transistor. Accordingly, the gate insulation layer pattern is usually formed using a material having a high dielectric constant.

When a gate conductive layer pattern including doped polysilicon is formed on the gate insulation layer pattern of the material having the high dielectric constant, a Fermi-level pinning effect may often occur so that mobilities of impurities doped in source/drain regions of the MOS transistor may be deteriorated. Thus, a flat band voltage (Vfb) of the MOS transistor, which is in proportion to a threshold voltage of the MOS transistor, may not be controllable within a desirable range.

In an effort to remedy the above-mentioned problem, metal has been used for a gate conductive layer pattern so as to reduce the Fermi-level pinning effect of the MOS transistor. When the gate conductive layer pattern includes metal, an increase of the EOT of the gate insulation layer pattern may be minimized by suppressing a poly depletion effect generated in the gate conductive layer pattern of doped polysilicon. Hence, a conventional gate structure in a MOS transistor generally includes a gate insulation layer pattern of high dielectric material and a gate conductive layer pattern of metal. Particularly, the gate conductive layer pattern usually includes a lower metal film adjusting a work function thereof, and an upper metal film serving as a wiring line for the MOS transistor.

As for the lower metal film of the gate conductive layer pattern, the work function of the gate conductive layer may vary in accordance with a type of the MOS transistor so as to properly adjust a threshold voltage of the MOS transistor. When the MOS transistor is an N type MOS (NMOS) transistor, the gate conductive layer pattern may have a work function of about 4.0 eV to about 4.3 eV. Meanwhile, the gate conductive layer pattern may have a work function of about 4.7 eV to about 5.0 eV when the MOS transistor is a P type MOS (PMOS) transistor.

In a formation of the MOS transistor, source/drain regions are formed by doping impurities into portions of a semiconductor substrate and by performing a thermal treatment process for activating the impurities doped into the semiconductor substrate. The thermal treatment process is usually performed at a temperature above about 1,000° C.

In the thermal treatment, however, the work function of the gate conductive layer pattern may be undesirably changed, deteriorating the electrical characteristics of the MOS transistor. For example, the work functions of the gate conductive layer pattern in the NMOS transistor may be changed from a range of about 4.0 eV to 4.3 eV into about 4.5 eV after the thermal treatment process. Additionally, the work function of the gate conductive layer pattern in the PMOS transistor may also be changed from a range of about 4.7 eV to 5.0 eV into about 4.5 eV. Such variations in the work functions of the gate conductive layer patterns may be caused by a reaction of the lower metal film relative to the upper metal film.

When the work function of the gate conductive layer pattern in the MOS transistor is changed to an undesired value, a threshold voltage of the MOS transistor may not be properly controlled. However, the thermal treatment process for activating the impurities is necessary for forming the source/drain regions so that this thermal treatment process may not be omitted from manufacturing processes of the MOS transistor. The present invention addresses these and other disadvantages of the conventional art.

SUMMARY

Embodiments of the present invention provide a transistor having a gate electrode including metal while maintaining a desired work function of the gate electrode. Embodiments of the present invention also provide a method of manufacturing a transistor having a gate electrode including metal while maintaining a desired work function of the gate electrode.

According to one aspect of the present invention, there is provided a transistor including source/drain regions, a channel region and a gate structure. The source/drain regions are formed at portions of a substrate. The channel region is formed at a portion of the substrate between the source/drain regions. The gate structure is formed on the channel region. The gate structure includes a gate insulation layer pattern and a gate electrode. The gate electrode includes a first gate conductive layer pattern and a second gate conductive layer pattern. The first gate conductive layer pattern has a nitrogen concentration gradient, and the second gate conductive layer pattern includes a material having a resistance substantially lower than a resistance of the first gate conductive layer pattern.

According to embodiments of the present invention, a work function of a gate electrode in a transistor may not be changed after a thermal treatment process for activating impurities doped in source/drain regions of the transistor. Therefore, the transistor may ensure proper electric characteristics such as desired threshold voltage, predetermined flat band voltage, etc.

BRIEF DESCRIPTION OF THE DRAWINGS

The above and other features and advantages of the present invention will become more apparent by describing in detail example embodiments thereof with reference to the accompanying drawings, in which.

DETAILED DESCRIPTION

Figure 1:
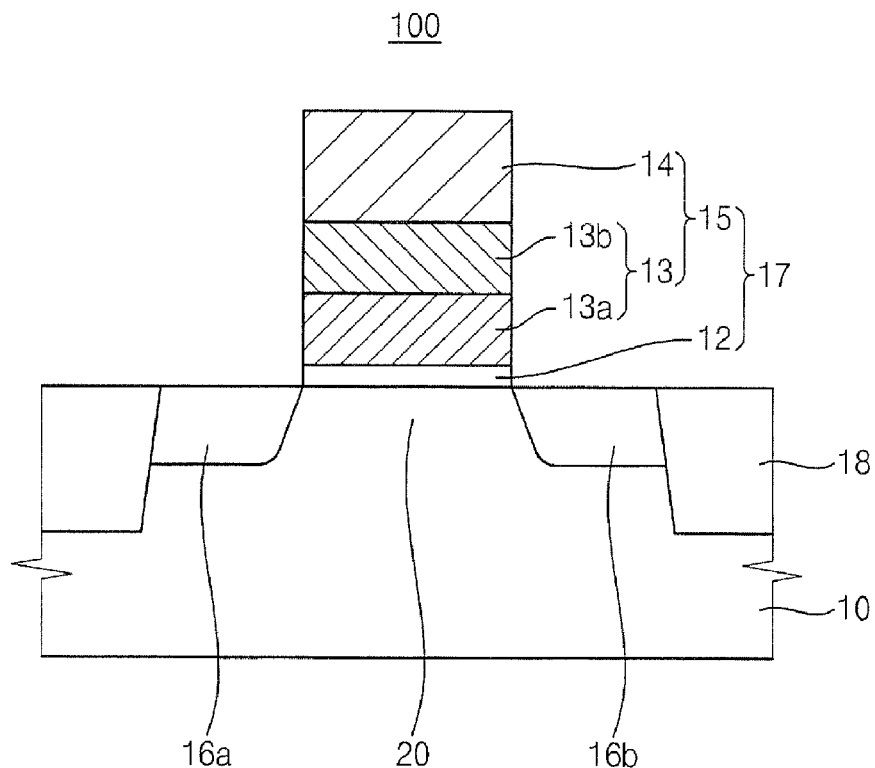
FIG. 1 is a cross-sectional view illustrating a semiconductor device in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" "connected to" or "coupled to" another element or layer, it can be directly on, connected or coupled to the other element or layer or intervening elements or layers may be present. In contrast, when an element is referred to as being "directly on" "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device in accordance with example embodiments of the present invention. Although a metal oxide semiconductor (MOS) transistor is illustrated in FIG. 1, the features of the present invention may be advantageously employed in other semiconductor devices such as other field effect transistors.

Referring to FIG. 1, a MOS transistor 100 is formed on a substrate 10. The substrate 10 may include a semiconductor substrate or a metal oxide substrate. For example, the substrate 10 may include a silicon substrate, a germanium substrate, a silicon-germanium substrate a silicon-on-insulator (SOI) substrate, a germanium-on-insulator (GOI) substrate, an aluminum oxide substrate, a titanium oxide substrate, a synthetic resin substrate, a gallium-arsenide substrate, etc. In an example embodiment, the substrate 10 may be the silicon substrate.

The MOS transistor 100 includes a gate structure 17 having a gate insulation layer pattern 12 and a gate electrode 15 formed on the substrate 10.

In one example embodiment of the present invention, the MOS transistor 100 may correspond to an N type MOS (NMOS) transistor. When the NMOS transistor is provided on the substrate 10, a P type well may be formed in the substrate 10. The P type well may be formed by doping P type impurities having a relatively low concentration into the substrate 10.

In another example embodiment of the present invention, the MOS transistor 100 may correspond to a P type MOS (PMOS) transistor. An N type well may be formed in the substrate 10 when the PMOS transistor is formed on the substrate 10. The N type well may be formed by doping N type impurities having a relatively low concentration into the substrate 10.

The gate structure 17 is formed on an active region of the substrate 10. The active region of the substrate 10 is defined by forming an isolation layer 18 at an upper portion of the substrate 10. A portion of the substrate 10 having the isolation layer 18 thereon may correspond to a field region. The isolation layer 18 may be formed by an isolation process such as a shallow trench isolation (STI) process or a thermal oxidation process. When the isolation layer 18 is formed by the STI process, the MOS transistor 100 may have an enhanced integration degree. The isolation layer 18 may include an oxide such as silicon oxide.

In example embodiments of the present invention, charge carriers in the MOS transistor 100 may include electrons or holes. The charge carriers may be generated from source/drain regions 16a and 16b formed at portions of the substrate 10 adjacent to the gate structure 17. The source/drain regions 16a and 16b may be formed by doping impurities into the portions of the substrate 10 adjacent to the gate structure 17. Examples of the impurities may include phosphorus (P), arsenic (As), boron (B), etc. For example, the source/drain regions 16a and 16b may be formed by an ion implantation process.

When the MOS transistor 100 corresponds to the NMOS transistor, the source/drain regions 16a and 16b may have N type conductivities, respectively. Here, the source/drain regions 16a and 16b may be formed using N type impurities to provide the electrons as the charge carriers in the NMOS transistor. Examples of the N type impurities may include phosphorus, arsenic, etc.

When the MOS transistor 100 corresponds to the PMOS transistor, the source/drain regions may have P type conductivities, respectively. Here, the source/drain regions 16a and 16b may be formed using P type impurities to provide the electrons as the charge carriers in the PMOS transistor. Examples of the P type impurities may include boron, gallium, indium, etc.

The source/drain regions 16a and 16b are formed adjacent to the gate structure 17, and thus a channel region 20 of the MOS transistor 100 may be provided on a portion of the substrate 10 beneath the gate structure 17. That is, the channel region 20 may be disposed between the source/drain regions 16a and 16b.

The gate insulation layer pattern 12 is formed on the channel region 20. The gate electrode 15 is formed on the gate insulation layer 12.

The gate insulation layer pattern 12 may have a thin equivalent oxide thickness (EOT). Additionally, the gate insulation layer pattern 12 may effectively reduce a leakage current generated between the gate electrode 15 and the channel region 20. In one example embodiment, the gate insulation layer pattern 12 may be formed using a metal oxide having a high dielectric constant. Examples of the metal oxide in the gate insulation layer pattern 12 may include hafnium oxide, zirconium oxide, tantalum oxide, aluminum oxide, titanium oxide, etc. These may be used alone or in a combination thereof. In another example embodiment, the gate insulation layer pattern 12 may be formed using a metal oxynitride. Examples of the metal oxynitride for the gate insulation layer pattern 12 may include hafnium oxynitride, hafnium silicon oxynitride, zirconium oxynitride, zirconium silicon oxynitride, tantalum oxynitride, tantalum silicon oxynitride, aluminum oxynitride, aluminum silicon oxynitride, titanium oxynitride, titanium silicon oxynitride, etc. These may be used alone or in a combination thereof. In still another example embodiment, the gate insulation layer pattern 12 may include silicon oxide or silicon oxynitride.

The gate electrode 15 includes a first gate conductive layer pattern 13 and a second gate conductive layer pattern 14. The first gate conductive layer pattern 13 may adjust a work function of the gate electrode 15, and the second gate conductive layer pattern 14 may serve as a word line.

In example embodiments of the present invention, the first gate conductive layer pattern 13 may include a metal or a metal compound having a work function of about 4.0 eV to about 4.3 eV or a work function of about 4.7 eV to about 5.0 eV. Examples of the metal or the metal compound used for the first gate conductive layer pattern 13 may include tantalum (Ta), titanium (Ti), titanium nitride (TiN), tungsten (W), nickel (Ni), tantalum silicide (TaSi), tungsten silicide (WSi), titanium silicide (TiSi), molybdenum silicide (MoSi), nickel silicide (NiSi), ruthenium (Ru), ruthenium oxide (RuO), iridium (Ir), iridium oxide (IrO), platinum (Pt), etc. These may be used alone or in a combination thereof.

When the MOS transistor 100 corresponds to the NMOS transistor, the metal or the metal compound having the work function of about 4.0 eV to about 4.3 eV may be used for the first gate conductive layer pattern 13. For example, the first gate conductive layer pattern 13 may include the metal compound such as tantalum silicide.

When the MOS transistor 100 corresponds to the PMOS transistor, the metal or the metal compound having the work function of about 4.7 eV to about 5.0 eV may be used for the first gate conductive layer pattern 13. For example, the first gate conductive layer pattern 13 may include the metal such as platinum or the metal compound, for example, titanium nitride or ruthenium oxide.

In example embodiments of the present invention, the first gate conductive layer pattern 13 may have a nitrogen concentration gradient. That is, the nitrogen concentration in the first gate conductive layer pattern 13 may gradually increase from a lower portion of the first gate conductive layer pattern 13 toward an upper portion of the first gate conductive layer pattern 13. The lower portion of the first gate conductive layer pattern 13 makes contact with the gate insulation layer pattern 12, and the upper portion of the first gate conductive layer pattern 13 makes contact with the second gate conductive layer pattern 14. When the first gate conductive layer pattern 13 has the nitrogen concentration gradient, a reaction between the first gate conductive layer pattern 13 and the second gate conductive layer pattern 14 may be prevented in a thermal treatment process for activating impurities doped in the source/drain regions 16a and 16b. In other words, nitrogen in the first gate conductive layer pattern 13 may effectively prevent the reaction between the first and the second gate conductive layer patterns 13 and 14 in the thermal treatment process because the upper portion of the first gate conductive layer pattern 13 may be substantially larger than the lower portion of the first gate conductive layer pattern 13. Additionally, the first gate conductive layer pattern 13 having the nitrogen concentration gradient may adjust the work function of the gate electrode 15 so that the work function of the gate electrode 15 may be maintained in the thermal treatment process. Furthermore, since the lower portion of the first gate conductive layer pattern 13 may have a relatively low nitrogen concentration, electrical characteristics of the gate insulation layer pattern 12 may not be deteriorated.

In some example embodiments of the present invention, the first gate conductive layer pattern 13 may have a multi-layered structure that includes a lower gate conductive film pattern 13a and an upper gate conductive film pattern 13b. The lower gate conductive film pattern 13a is formed on the gate insulation layer pattern 12, and the upper gate conductive film pattern 13b is formed on the lower gate conductive film pattern 13a. The lower gate conductive film pattern 13a may include a metal or a metal compound without nitrogen, whereas the upper gate conductive film pattern 13b may include a metal compound containing nitrogen. For example, the lower gate conductive film pattern 13a may include tantalum, titanium, tungsten, nickel, tantalum silicide, tungsten silicide, titanium silicide, molybdenum silicide, nickel silicide, ruthenium, ruthenium oxide, iridium, iridium oxide, platinum, etc. These may be used alone or in a combination thereof. Additionally, the upper gate conductive film pattern 13b may include tantalum nitride (TaN), tungsten nitride (WN), nickel nitride (NiN), tantalum silicon nitride (TaSiN), tungsten silicon nitride (WSiN), titanium silicon nitride (TiSiN), molybdenum silicon nitride (MoSiN), nickel silicon nitride (NiSiN), ruthenium nitride (RuN), ruthenium oxynitride (RuNO), iridium nitride (IrN), iridium oxynitride (IrON), platinum nitride (PtN), etc. These may be used alone or in a combination thereof.

The metal in the lower gate conductive film pattern 13a of the first gate conductive layer pattern 13 may vary in accordance with the type of the MOS transistor 100 (e.g., the NMOS transistor or the PMOS transistor). The metal in the upper gate conductive film pattern 13b of the first gate conductive layer pattern 13 may not vary in accordance with the type of the MOS transistor 100, since only the lower gate conductive film pattern 13a may adjust the work function of the gate electrode 15. However, the metal in the upper gate conductive film pattern 13a may also vary in accordance with the type of the MOS transistor 100.

In other example embodiments of the present invention, the first gate conductive layer pattern 13 may have a single-layered structure. The first gate conductive layer pattern 13 may include a metal compound that contains nitrogen. For example, the first gate conductive layer pattern 13 may include tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride, platinum nitride, etc. Here, a nitrogen concentration in the first gate conductive layer pattern 13 may gradually increase from a lower portion of the first gate conductive layer pattern 13 to an upper portion of the first gate conductive layer pattern 13. Namely, the first gate conductive layer pattern 13 may have a nitrogen concentration gradient. The nitrogen concentration gradient in the first gate conductive layer pattern 13 may be obtained by adjusting process conditions thereof or by performing a nitration process on the first gate conductive layer pattern 13.

Referring now to FIG. 1, the second gate conductive layer pattern 14 may serve as the word line in a semiconductor device. The second gate conductive layer pattern 14 may include a metal having a resistance substantially lower than a resistance of the metal in the first gate conductive layer pattern 13. Examples of the metal used for the second gate conductive layer pattern 14 may include tungsten or aluminum. Alternatively, the second gate conductive layer pattern 14 may be formed using doped polysilicon.

According to example embodiments of the present invention, the first gate conductive layer pattern 13 of the MOS transistor 100 may include a metal containing nitrogen. Additionally, the nitrogen concentration in the first gate conductive layer pattern 13 may gradually increase from the lower portion thereof toward the upper portion thereof. Hence, the reaction of the first and the second gate conductive layer patterns 13 and 14 may be sufficiently prevented, and also a change in the work function of the gate electrode 15 may be effectively prevented. As a result, the MOS transistor 100 may have improved electrical characteristics.

FIGS. 2A to 2D are cross-sectional views illustrating a method of manufacturing a semiconductor device in accordance with example embodiments of the present invention. Although FIGS. 2A to 2D illustrate a method of manufacturing a MOS transistor, the features of the present invention may be advantageously employed for other semiconductor devices such as field effect transistors.

Figure 2A:
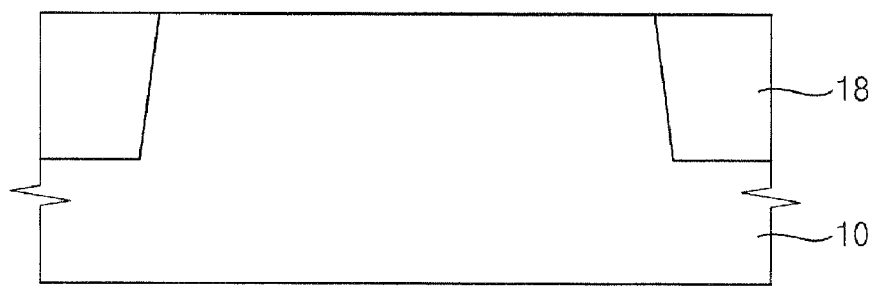
FIGS. 2A through 2D are cross-sectional views illustrating a method of manufacturing a semiconductor device in accordance with example embodiments of the present invention.

Referring to FIG. 2A, after a well (not illustrated) is formed in a substrate 10 by doping impurities having a relatively low concentration, an isolation layer 18 is formed on the substrate 10. When the MOS transistor corresponds to an NMOS transistor, a P type well may be formed in the substrate 10 by doping P type impurities having the relatively low concentration into the substrate 10. When the MOS transistor corresponds to a PMOS transistor, an N type well may be formed in the substrate 10 by doping N type impurities having a relatively low concentration into the substrate 10.

The isolation layer 18 may divide the substrate 10 into an active region and a field region. The isolation layer 18 may be formed using an oxide such as silicon oxide. Additionally, the isolation layer 18 may be formed by an STI process to ensure a required integration degree of the MOS transistor.

Figure 2B:
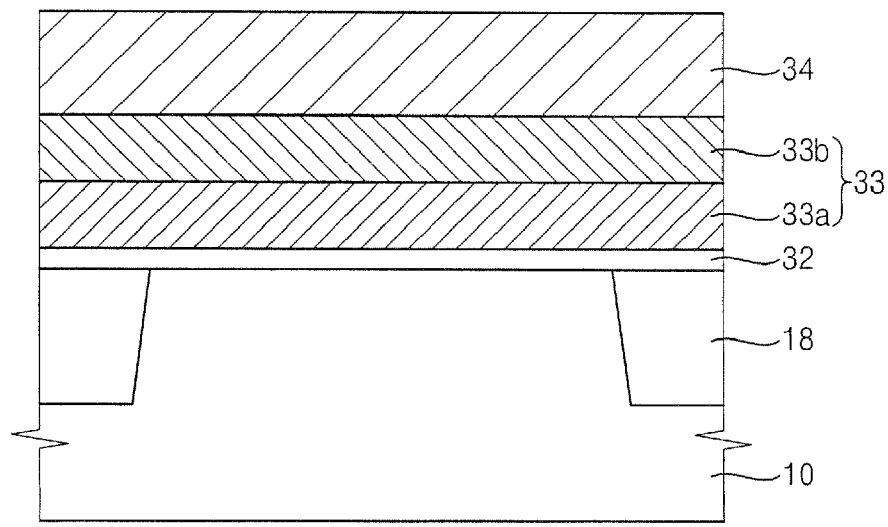

Referring to FIG. 2B, an insulation layer 32 is formed on the substrate 10. The insulation layer 32 will be patterned to form a gate insulation layer pattern 12 (see FIG. 2C). The insulation layer 32 may be formed using a metal oxide or a metal oxynitride. For example, the insulation layer 32 may be formed using hafnium oxide, zirconium oxide, hafnium oxynitride, hafnium silicon oxynitride, zirconium oxynitride, zirconium silicon oxynitride, tantalum oxynitride, tantalum silicon oxynitride, aluminum oxynitride, etc. The insulation layer 32 may have a thin equivalent oxide thickness (EOT) below about 20 Å. Additionally, the insulation layer 32 may be formed by an atomic layer deposition (ALD) process, a chemical vapor deposition (CVD) process, a sputtering process, an evaporation process, etc.

After the insulation layer 32 is formed on the substrate 10, a stabilizing process may be performed on the insulation layer 32 so as to cure defects generated in the insulation layer 32. The stabilizing process may include a thermal treatment process. Here, the stabilizing process for the insulation layer 32 may be carried out under an atmosphere including nitrogen and/or oxygen. Further, the stabilizing process may be executed using nitrogen plasma and/or ozone.

Referring again to FIG. 2B, a first conductive layer 33 is formed on the insulation layer 32. The first conductive layer 33 will be patterned to form a first gate conductive layer pattern 15 (see FIG. 2C). The first conductive layer 33 may be formed using a metal that includes nitrogen. Here, a nitrogen concentration in the first conductive layer 33 may be adjusted so that the nitrogen concentration in the first conductive layer 33 may gradually increase from a lower portion of the first conductive layer 33 to an upper portion of the first conductive layer 33. That is, the lower portion of the first conductive layer 33 making contact with the insulation layer 32 may have a nitrogen concentration substantially lower than the upper portion of the first conductive layer 33.

In some example embodiments of the present invention, the first conductive layer 33 may have a multi-layered structure. In a formation of the first conductive layer 33 as illustrated in FIG. 2B, a lower conductive film 33a is formed on the insulation layer 32. The lower conductive film 33a may be formed using a metal or a metal compound that does not include nitrogen. The lower conductive film 33a may be formed by a CVD process, an ALD process, a sputtering process, an evaporation process, etc. Examples of the metal or the metal compound used for the lower conductive film 33a may include tantalum, titanium, tungsten, nickel, tantalum silicide, tungsten silicide, titanium silicide, molybdenum silicide, nickel silicide, ruthenium, ruthenium oxide, iridium, iridium oxide, platinum, etc. These may be used alone or in a combination thereof.

The lower conductive film 33a may have a work function of about 4.0 eV to about 4.3 eV or about 4.7 eV to about 5.0 eV. When the MOS transistor corresponds to the NMOS transistor, the lower conductive film 33a may be formed using the metal or the metal compound having a work function of about 4.0 eV to about 4.3 eV. When the MOS transistor corresponds to the PMOS transistor, the lower conductive film 33a may be formed using the metal or the metal compound having a work function of about 4.7 eV to about 5.0 eV. After a formation of the lower conductive film 33a, an upper conductive film 33b is formed on the lower conductive film 33a.

The upper conductive film 33b may be formed using a metal compound including nitrogen. The upper conductive film 33b may be formed by a CVD process, an ALD process, a sputtering process, an evaporation process, etc. Examples of the metal compound for the upper conductive film 33b may include tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride, platinum nitride, etc. These may be used alone or in a combination thereof. The metal compound for the upper conductive film 33b may vary in accordance with a type of the MOS transistor. Alternatively, the metal compound in the upper conductive film 33b may not vary in accordance with the type of the MOS transistor.

In other example embodiments of the present invention, the first conductive layer 33 may have a single-layered structure. Here, the first conductive layer 33 may be formed using a metal compound that contains nitrogen. For example, the first conductive layer 33 may be formed using tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride, platinum nitride, etc. These may be used alone or in a combination thereof.

Additionally, the first conductive layer 33 may be formed by an in-situ process or an ex-situ process.

In the ex-situ process for forming the first conductive layer 33, a preliminary first conductive layer may be formed on the insulation layer 32 using a metal or a metal compound without nitrogen. Then, a nitration process may be performed on the preliminary first conductive layer to form the first gate conductive layer 33. The nitration process may include a plasma nitration process.

In the in-situ process for forming the first gate conductive layer 33, the first gate conductive layer 33 may be formed on the insulation layer 32 while increasing a feeding time of nitrogen. That is, the feeding time of nitrogen may continuously increase when forming the first gate conductive layer 33. Thus, the first gate conductive layer 33 may have a nitrogen concentration gradient as described above.

After forming the first conductive layer 33 on the insulation layer 32, a second conductive layer 34 is formed on the first conductive layer 33. The second conductive layer 34 will be patterned to form the second gate conductive layer pattern 14 (see FIG. 2C). The second conductive layer 34 may be formed using a material having a resistance substantially lower than a resistance of the first conductive layer 33. The second conductive layer 34 may be formed by a CVD process, an ALD process, a sputtering process, an evaporation process, etc.

In example embodiments of the present invention, a hard mask may be formed on the second conductive layer 34. The hard mask may be formed using a material that has an etching selectivity relative to the second conductive layer 34, the first conductive layer 33 and the insulation layer 32. For example, the mask may be formed using a nitride such as silicon nitride. The hard mask may serve as an etching mask for forming a gate structure 17 (see FIG. 2C). Further, the hard mask may serve as an insulation mask for electrically insulating the gate structure 17 from an upper conductive structure.

Figure 2C:
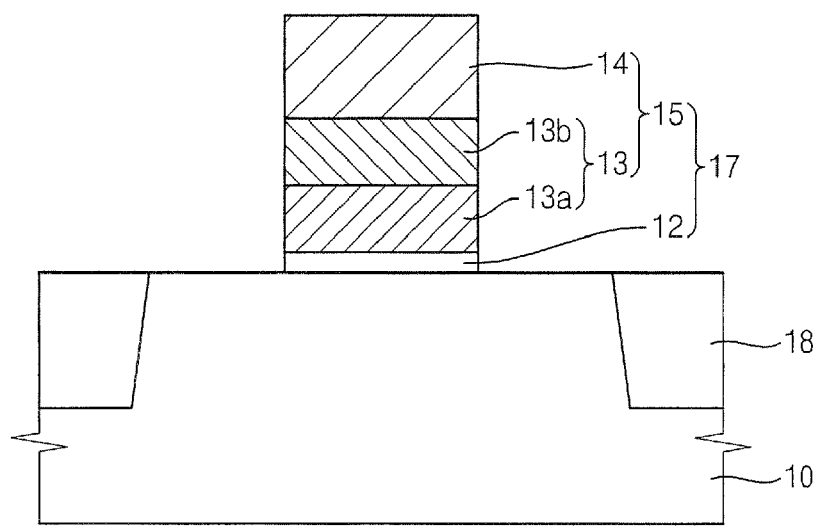

Referring to FIG. 2C, the second conductive layer 34, the first conductive layer 33 and the insulation layer 32 are patterned to form the gate structure 17 on the substrate 10. The gate structure 17 includes a gate insulation layer pattern 12 and a gate electrode 15. In example embodiments, the gate electrode 15 includes a first gate conductive layer pattern 13 and a second gate conductive layer pattern 14. The first gate conductive layer pattern 13 may include a lower conductive film pattern 13a and an upper conductive film pattern 13b when the first conductive layer 33 has the multi-layered structure.

Figure 2D:
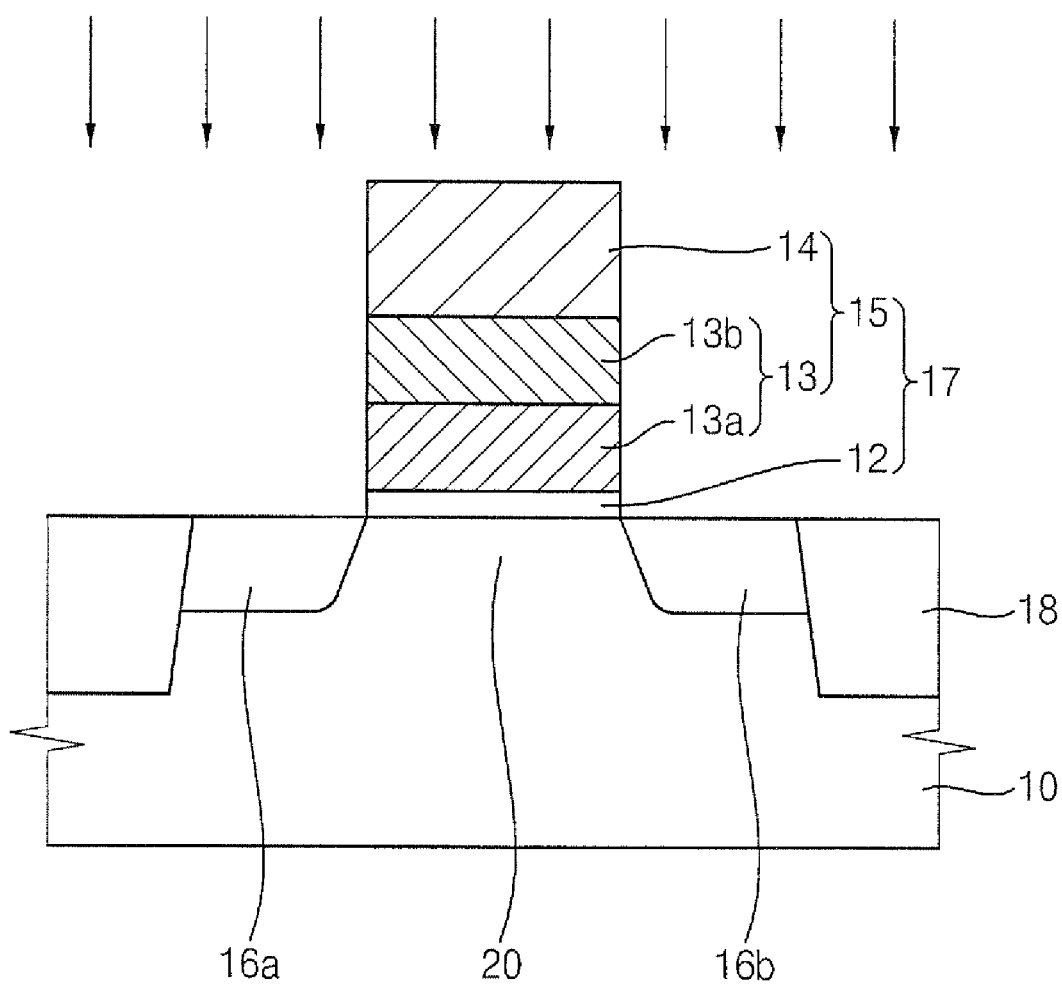

Referring to FIG. 2D, source/drain regions 16a and 16b are formed at portions of the substrate 10 adjacent to the gate structure 17. The source/drain regions 16a and 16b may be formed by an ion implantation process using the gate structure 17 as an ion implantation mask. When the MOS transistor corresponds to the NMOS transistor, the source/drain regions 16a and 16b may be formed by doping N type impurities such as phosphorous, arsenic, etc. When the MOS transistor corresponds to the PMOS transistor, source/drain regions 16a and 16b may be formed by doping P type impurities such as boron, gallium, indium, etc.

In example embodiments of the present invention, a gate spacer (not illustrated) may be formed on a sidewall of the gate structure 17 after forming the source/drain regions 16a and 16b. The gate spacer may be formed using a nitride, for example, silicon nitride. The gate spacer may be formed by forming a nitride layer on the gate structure 17 and by anisotropically etching the nitride layer. When the gate spacer is located on the sidewall of the gate structure 17, an additional ion implantation process may be performed using the gate structure 17 and the gate spacer as ion implantation masks. Thus, the source/drain regions 16a and 16b may have a lightly doped drain (LDD) structure. That is, the source/drain regions 16a and 16b may each include shallow doping regions and deep doping regions.

After forming the gate structure 17 and the source/drain regions 16a and 16b on the substrate 10, a thermal treatment may be performed on the substrate 10 to activate impurities doped in the source/drain regions 16a and 16b. The thermal treatment process may be carried out at a relatively high temperature above about 1,000° C.

According to example embodiments of the present invention, the gate structure 17 including the first gate conductive layer pattern 13 may maintain a required work function even though the thermal treatment is performed at the high temperature because the first gate conductive layer pattern 13 may effectively prevent variations in the work function of the gate structure 17. That is, the first gate conductive layer pattern 13 may have the nitrogen concentration gradient so that a change in the work function of the gate structure 17 may be sufficiently prevented. Thus, electrical characteristics of the MOS transistor including the gate structure 17 may be advantageously improved, and also the MOS transistor may be easily manufactured.

Evaluation of Capacitance-Voltage (C-V) Characteristics of MOS Transistors

Figure 3:
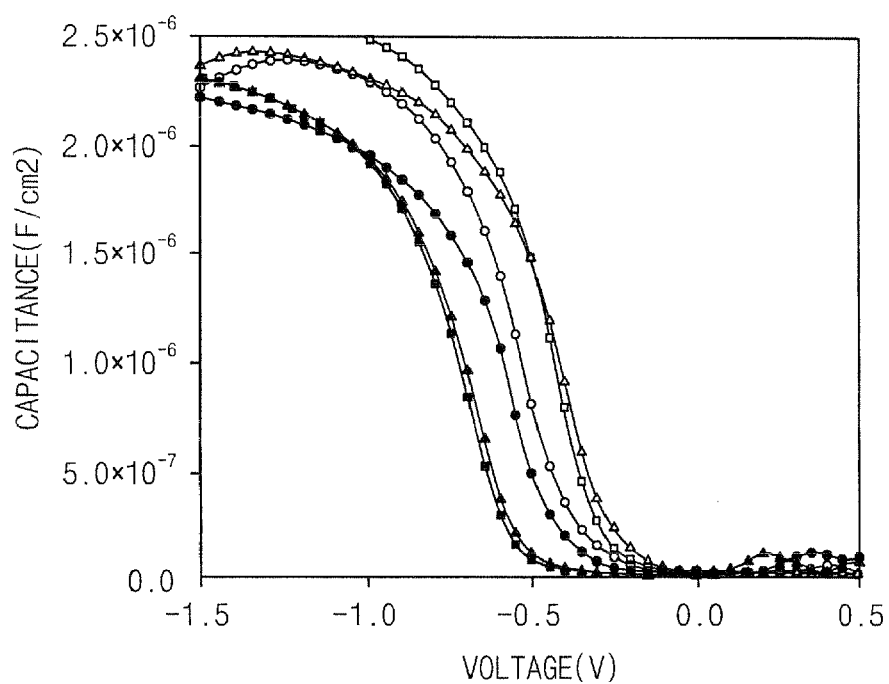
FIG. 3 is a graph illustrating C-V curves of MOS transistors in accordance with example embodiments of the present invention.

FIG. 3 is a graph illustrating C-V curves of MOS transistors in accordance with example embodiments of the present invention.

In FIG. 3, "□" indicates a variation of a capacitance relative to a voltage in a first MOS transistor. The first MOS transistor included a first gate conductive layer pattern of titanium nitride, and a thermal treatment process for activating doped impurities was not performed when forming source/drain regions of the first MOS transistor. "Δ" denotes a variation of a capacitance relative to a voltage in a second MOS transistor. The second MOS transistor included a first gate conductive layer pattern of titanium nitride and tantalum silicon nitride, and a thermal treatment process for source/drain regions of the second MOS transistor was performed at a temperature of about 1,000° C. "○" represents a variation of a capacitance relative to a voltage in a third MOS transistor including a first gate conductive layer pattern of titanium nitride. Source/drain regions of the third MOS transistor were formed by a thermal treatment process performed at a temperature of about 1,000° C. The first to the third MOS transistors have the first gate conductive layers including titanium nitride that has a work function of about 4.65 eV, so that the first to the third MOS transistors correspond to PMOS transistors, respectively. The first MOS transistor is an example of a transistor according to embodiments of the present invention, but it is not subjected to the thermal treatment process. The second MOS transistor is an example of a transistor according to embodiments of the present invention and is subjected to the thermal treatment process. For purposes of comparison, the third transistor is an example of a transistor according to the conventional art and is subjected to the thermal treatment process.

Additionally, "■" denotes a variation of a capacitance relative to a voltage in a fourth MOS transistor including a first gate conductive layer pattern of tantalum silicide. Source/drain regions of the fourth MOS transistor were formed without performing a thermal treatment process for activating doped impurities. "▲" denotes a variation of a capacitance relative to a voltage in a fifth MOS transistor including a first gate conductive layer pattern of tantalum silicide and tantalum silicon nitride. Source/drain regions of the fifth MOS transistor were formed by performing a thermal treatment process at a temperature of about 1,000° C. "●" indicates a variation of a capacitance relative to a voltage in a sixth MOS transistor including a first gate conductive layer pattern of tantalum silicide. Source/drain regions of the sixth MOS transistor were formed by performing a thermal treatment process at a temperature of about 1,000° C. The fourth to the sixth MOS transistors have the first gate conductive layers including tantalum silicide having a work function of about 4.3 eV, so that the fourth to sixth MOS transistors correspond to NMOS transistors, respectively. The fourth MOS transistor is an example of a transistor according to embodiments of the present invention, but it is not subjected to the thermal treatment process. The fifth MOS transistor is an example of a transistor according to embodiments of the present invention and is subjected to the thermal treatment process. For purposes of comparison, the sixth transistor is an example of a transistor according to the conventional art and is subjected to the thermal treatment process.

As illustrated in FIG. 3, the first MOS transistor may have C-V characteristics substantially similar to those of the second MOS transistor. Additionally, C-V characteristics of the fourth MOS transistor are substantially similar to those of the fifth MOS transistor. Furthermore, the third and the sixth MOS transistors have substantially similar C-V characteristics.

As for the MOS transistors including the first gate conductive layer patterns according to example embodiments of the present invention, the MOS transistors may have desired electrical characteristics even though the thermal treatment process for forming the source/drain regions is carried out at the high temperature because work functions of gate electrodes in the MOS transistors may not be substantially changed after the thermal treatment process.

Evaluation of Flat Band Voltages of MOS Transistors

Figure 4:
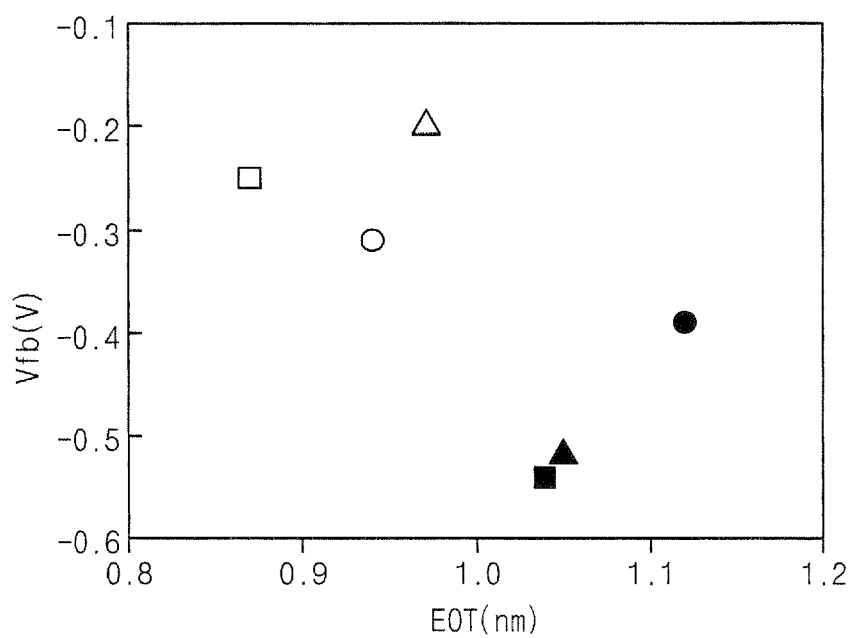
FIG. 4 is a graph illustrating flat band voltages of MOS transistors in accordance with example embodiments of the present invention.

FIG. 4 is a graph illustrating flat band voltages of MOS transistors in accordance with example embodiments of the present invention.

In FIG. 4, "○" denotes a flat band voltage of the third MOS transistor, and "Δ" denotes a flat band voltage of the second MOS transistor. Additionally, "□" indicates a flat band voltage of the first MOS transistor, and "●" represents a flat band voltage of the sixth MOS transistor. Furthermore, "▲" denotes a flat band voltage of the fifth MOS transistor, and "■" denotes a flat band voltage of the fourth MOS transistor.

As illustrated in FIG. 4, the first MOS transistor had the flat band voltage substantially similar to that of the second MOS transistor. The flat band voltage of the second MOS transistor was about −0.25V. This flat band voltage of about −0.25V corresponded to a work function of about 4.65 eV. However, the flat band voltage of the third MOS transistor was slightly changed. That is, the flat band voltage of the third MOS transistor was changed into about −0.35V after the thermal treatment process was performed. The flat band voltage of about −0.35V corresponded to a work function of about 4.5 eV.

The fourth MOS transistor had the flat band voltage substantially similar to that of the fifth MOS transistor. The flat band voltage of the fifth MOS transistor was about −0.55V. Such flat band voltage of about −0.55V corresponded to a work function of about 4.3 eV. However, the flat band voltage of the sixth MOS transistor was changed. Namely, the flat band voltage of the sixth MOS transistor was changed into about −0.35V after the thermal treatment process. The flat band voltage of about −0.35V corresponded to a work function of about 4.5 eV.

Therefore, the flat band voltages of the MOS transistors according to example embodiments of the present invention may not be substantially changed after the thermal treatment process since the work functions of the first gate conductive layer patterns are not changed after the thermal treatment process.

Evaluation of Nitrogen Distributions in MOS Transistors

Figure 5:
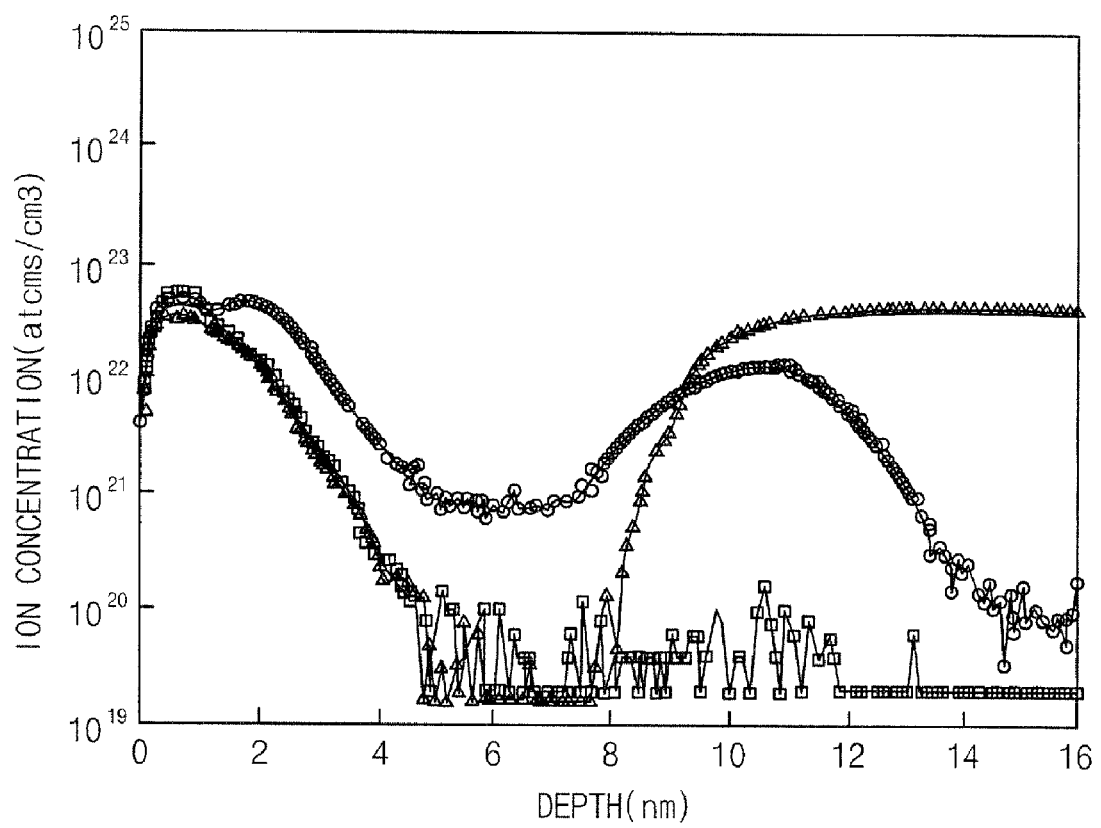
FIG. 5 is a graph illustrating nitrogen distributions of MOS transistors in accordance with example embodiments of the present invention.

FIG. 5 is a graph illustrating nitrogen distributions in MOS transistors in accordance with example embodiments of the present invention.

In FIG. 5, "Δ" represents a nitrogen concentration relative to a depth of a gate structure in a seventh MOS transistor. The seventh MOS transistor included a gate insulation layer pattern of hafnium silicon oxide, a first gate conductive layer pattern of tantalum silicon and tantalum silicon nitride, and a second gate conductive layer pattern of tungsten and titanium nitride. Source/drain regions of the seventh MOS transistor were formed by performing a thermal treatment process at a temperature of about 1,000° C.

Additionally, "□" denotes a nitrogen concentration relative to a depth of a gate structure in an eighth MOS transistor. The eighth MOS transistor included a gate insulation layer pattern of hafnium silicon oxide, a first gate conductive layer pattern of tantalum silicon, and a second gate conductive layer pattern of tungsten and titanium nitride. The eighth MOS transistor was obtained without a thermal treatment process.

Furthermore, "○" indicates a nitrogen concentration relative to a depth of a gate structure in a ninth MOS transistor. The ninth MOS transistor had a gate insulation layer pattern of hafnium silicon oxide, a first gate conductive layer pattern of tantalum silicon, and a second gate conductive layer pattern of tungsten and titanium nitride. Source/drain regions of the ninth MOS transistor were formed by performing a thermal treatment process at a temperature of about 1,000° C. Nitrogen distributions of the seventh to the ninth MOS transistors were measured by a backside analysis method using secondary ion mass spectroscopy (SIMS).

Referring to FIG. 5, nitrogen concentrations in the first gate conductive layer patterns of the seventh and the eighth MOS transistors are much lower than other portions of the gate structures in the seventh and the eighth MOS transistors. On the other hand, a nitrogen concentration in the first gate conductive layer pattern of the ninth MOS transistor is relatively high because titanium nitride in the second gate conductive layer pattern reacts with tantalum silicon in the first gate conductive layer pattern in the thermal treatment process.

When the MOS transistors include the first gate conductive layer patterns according to example embodiments of the present invention, the first gate conductive layer pattern may not react with the second gate conductive layer pattern. Thus, electrical characteristics of the MOS transistors may not be deteriorated after the thermal treatment process.

According to example embodiments of the present invention, a work function of a gate electrode in a MOS transistor may not be changed after a thermal treatment process for activating impurities doped in source/drain regions of the MOS transistor. Therefore, the MOS transistor may ensure proper electric characteristics such as desired threshold voltage, predetermined flat band voltage, etc.

According to one aspect of the present invention, there is provided a semiconductor device including source/drain regions, a channel region and a gate structure. The source/drain regions are formed at portions of a substrate. The channel region is formed at a portion of the substrate between the source/drain regions. The gate structure is formed on the channel region. The gate structure includes a gate insulation layer pattern and a gate electrode. The gate electrode includes a first gate conductive layer pattern and a second gate conductive layer pattern. The first gate conductive layer pattern has a nitrogen concentration gradient, and the second gate conductive layer pattern includes a material having a resistance substantially lower than a resistance of the first gate conductive layer pattern.

In example embodiments of the present invention, the first gate conductive layer pattern may have a nitrogen concentration gradually increasing from a lower portion of the first gate conductive layer pattern to an upper portion of the first gate conductive layer pattern.

In example embodiments of the present invention, the source/drain regions may independently include impurities such as phosphorous (P), arsenic (As), boron (B), gallium (Ga) or indium (In).

In example embodiments of the present invention, the first gate conductive layer pattern may have a work function of about 4.0 eV to about 4.3 eV or about 4.7 eV to about 5.0 eV.

In example embodiments of the present invention, the first gate conductive layer pattern may include tantalum, titanium, titanium nitride, tungsten, nickel, tantalum silicide, tungsten silicide, titanium silicide, molybdenum silicide, nickel silicide, ruthenium, ruthenium oxide, iridium, iridium oxide, platinum, etc. These may be used alone or in a combination thereof.

In example embodiments of the present invention, the first gate conductive layer pattern may include a lower gate conductive film pattern and an upper gate conductive film pattern. The lower gate conductive film pattern may be formed on the gate insulation layer pattern. The lower gate conductive film pattern may include a metal or a metal compound without nitrogen. The upper gate conductive film pattern may be formed on the lower gate conductive film pattern. The upper gate conductive film pattern may include a metal compound including nitrogen. For example, the lower gate conductive film pattern may include tantalum, titanium, tungsten, nickel, tantalum silicide, tungsten silicide, titanium silicide, molybdenum silicide, nickel silicide, ruthenium, ruthenium oxide, iridium, iridium oxide, platinum, etc. These may be used alone or in a combination thereof. The upper gate conductive film pattern may include tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride, platinum nitride, etc. These may be used alone or in a combination thereof.

In example embodiments of the present invention, the second gate conductive layer pattern may include tungsten, aluminum or doped polysilicon. These may be used alone or in a combination thereof.

According to another aspect of the present invention, there is provided a semiconductor device including N type source/drain regions, a channel region and a gate structure. The N type source/drain regions are formed at portions of a substrate. The channel region is formed at a portion of the substrate between the source/drain regions. The gate structure is formed on the channel region. The gate structure includes a gate insulation layer pattern and a gate electrode. The gate electrode includes a first gate conductive layer pattern and a second gate conductive layer pattern. The first gate conductive layer pattern has a nitrogen concentration gradient gradually increasing from a lower portion of the first gate conductive layer pattern to an upper portion of the first gate conductive layer pattern. The first gate conductive layer pattern includes a metal or a metal compound having a work function of about 4.0 eV to about 4.3 eV. The second gate conductive layer pattern includes a material having a resistance substantially lower than a resistance of the first gate conductive layer pattern.

According to still another aspect of the present invention, there is provided a semiconductor device including P type source/drain regions, a channel region and a gate structure. The P type source/drain regions are formed at portions of a substrate. The channel region is formed at a portion of the substrate between the source/drain regions. The gate structure is formed on the channel region. The gate structure includes a gate insulation layer pattern and a gate electrode. The gate electrode includes a first gate conductive layer pattern and a second gate conductive layer pattern. The first gate conductive layer pattern has a nitrogen concentration gradient gradually increasing from a lower portion of the first gate conductive layer pattern to an upper portion of the first gate conductive layer pattern. The first gate conductive layer pattern includes a metal or a metal compound having a work function of about 4.7 eV to about 5.0 eV. The second gate conductive layer pattern includes a material having a resistance substantially lower than a resistance of the first gate conductive layer pattern.

According to still another aspect of the present invention, there is provided a method of manufacturing a semiconductor device. In the method of manufacturing the semiconductor device, an insulation layer is formed on a substrate. A first conductive layer is formed on the insulation layer using a metal or a metal compound that has a nitrogen concentration gradient gradually increasing from a lower portion of the first conductive layer to an upper portion of the first conductive layer. A second conductive layer is formed on the first conductive layer using a material having a resistance substantially lower than a resistance of the first conductive layer. The insulation layer, the first conductive layer and the second conductive layer are patterned to form a gate structure including a gate insulation layer pattern and a gate electrode. Source/drain regions are formed by doping impurities at portions of the substrate adjacent to the gate structure. The impurities in the source/drain regions are activated by a thermal treatment process.

In a formation of the first conductive layer according to example embodiments of the present invention, a lower conductive film may be formed on the insulation layer using a metal or a metal compound without nitrogen. An upper conductive film may be formed on the lower conductive film using a metal compound including nitrogen. The lower conductive film may be formed using tantalum, titanium, tungsten, nickel, tantalum silicide, tungsten silicide, titanium silicide, molybdenum silicide, nickel silicide, ruthenium, ruthenium oxide, iridium, iridium oxide, platinum, etc. These may be used alone or in a mixture thereof. The upper conductive film may be formed using tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride, platinum nitride, etc. These may be used alone or in a mixture thereof.

In a formation of the first conductive layer according to example embodiments of the present invention, a preliminary first conductive layer may be formed on the insulation layer using a metal or a metal compound without nitrogen. A nitration process may be performed on the preliminary first conductive layer.

In example embodiments of the present invention, the first conductive layer may be formed by increasing a feeding time of nitrogen in proportion to a time for forming the first conductive layer.

In example embodiments of the present invention, the impurities in the source/drain regions may independently include phosphorous, arsenic, boron, gallium or indium. The impurities in the source/drain regions may be doped by an ion implantation process.

In example embodiments of the present invention, the thermal treatment process may be performed at a temperature above about 1,000° C.

According to the present invention, a work function of a gate electrode in a semiconductor device may not be changed after a thermal treatment process for activating impurities doped in source/drain regions of the transistor. Therefore, the semiconductor device may ensure proper electric characteristics such as desired threshold voltage, predetermined flat band voltage, etc.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, comprising:
    forming an insulation layer on a substrate;
    forming a lower first conductive layer on the insulation layer using a metal or a metal compound without nitrogen, the lower first conductive layer having a work function of about 4.0 eV to about 4.3 eV or about 4.7 eV to about 5.0 eV;
    forming an upper first conductive layer on the lower first conductive layer using a metal compound including nitrogen;
    forming a second conductive layer including nitrogen on the upper first conductive layer using a material having a resistance substantially lower than a resistance of the lower first conductive layer and the upper first conductive layer;
    patterning the insulation layer, the lower first conductive layer, the upper first conductive layer and the second conductive layer to form a gate structure including a gate insulation layer pattern and a gate electrode;
    forming source/drain regions by doping impurities at portions of the substrate adjacent to the gate structure; and
    activating the impurities in the source/drain regions by a thermal treatment process,
    wherein the upper first conductive layer including nitrogen prevents the lower first conductive layer from reacting with the second conductive layer including nitrogen and prevents an increase of a nitrogen concentration in the lower first conductive layer during the thermal treatment process to keep the work function of the lower first conductive layer substantially constant.

2. The method of claim 1, wherein the lower first conductive layer is formed using at least one selected from the group consisting of tantalum, titanium, tungsten, nickel, tantalum silicide, tungsten silicide, titanium silicide, molybdenum silicide, nickel silicide, ruthenium, ruthenium oxide, iridium, iridium oxide and platinum, and the upper first conductive layer is formed using at least one selected from the group consisting of tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride and platinum nitride.

3. The method of claim 1, wherein forming the upper first conductive layer comprises:
    forming a preliminary upper first conductive layer on the lower first conductive layer using a metal or a metal compound without nitrogen; and
    performing a nitridation process on the preliminary upper first conductive layer.

4. The method of claim 1, wherein the impurities in the source/drain regions independently comprise phosphorous, arsenic, boron, gallium or indium.

5. The method of claim 1, wherein forming source/drain regions comprises an ion implantation process.

6. The method of claim 1, wherein the thermal treatment process is performed at a temperature above about 1,000° C.

* * * * *